US012720933B2

(12) United States Patent
Liu et al.

(10) Patent No.: US 12,720,933 B2
(45) Date of Patent: Aug. 25, 2026

(54) DRIVE BACKPLANE AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Chunjian Liu, Beijing (CN); Zouming Xu, Beijing (CN); Jie Lei, Beijing (CN); Jian Tian, Beijing (CN); Xintao Wu, Beijing (CN); Qin Zeng, Beijing (CN); Jie Wang, Beijing (CN); Yufei Zhan, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 749 days.

(21) Appl. No.: 18/000,198

(22) PCT Filed: Dec. 25, 2020

(86) PCT No.: PCT/CN2020/139494
§ 371 (c)(1),
(2) Date: Nov. 29, 2022

(87) PCT Pub. No.: WO2022/134019
PCT Pub. Date: Jun. 30, 2022

(65) Prior Publication Data

US 2023/0207761 A1 Jun. 29, 2023

(51) Int. Cl.

| | |
|---|---|
| ***H10H 20/857*** | (2025.01) |
| ***H10H 20/831*** | (2025.01) |
| ***H10W 90/00*** | (2026.01) |

(52) U.S. Cl.
CPC ...... *H10H 20/857* (2025.01); *H10H 20/8312* (2025.01); *H10W 90/00* (2026.01)

(58) Field of Classification Search
CPC ................ H10H 20/857; G02F 1/1345; G09G 2300/0426
See application file for complete search history.

(56) References Cited

U.S. PATENT DOCUMENTS 5,499,131 A * 3/1996 Kim ...................... G02F 1/1345 349/149
2007/0216845 A1 9/2007 Liao et al.
(Continued)

FOREIGN PATENT DOCUMENTS

CN 2187315 Y 1/1995
CN 1961251 A 5/2007
(Continued)

OTHER PUBLICATIONS

Office Action dated Apr. 15, 2023 in corresponding CN application No. 202080003699.0.
(Continued)

*Primary Examiner* — Priyank J Shah
(74) *Attorney, Agent, or Firm* — Workman Nydegger

(57) ABSTRACT

A drive backplane includes: a base substrate, binding electrodes, signal lines, and fan-out lines. The signal lines extend in a second direction and are arranged in a first direction. At least two signal lines have different lengths in the second direction. At least one fan-out line includes an oblique line portion and a first straight line portion. One end of the oblique line portion is coupled to the end of the signal line close to the binding electrode, and the other end thereof is coupled to the first straight line portion. The end of the first straight line portion away from the oblique line portion is coupled to the binding electrode. The distance, in a direction perpendicular to the first direction, between the two ends of
(Continued)

the oblique line portion is a first distance, and the first distances of at least two oblique line portions are different.

15 Claims, 9 Drawing Sheets

(56) References Cited

U.S. PATENT DOCUMENTS

| | | | |
|---|---|---|---|
| 2007/0285370 | A1 | 12/2007 | Kim |
| 2008/0018583 | A1 | 1/2008 | Knapp et al. |
| 2013/0141877 | A1 | 6/2013 | Lau et al. |
| 2015/0301404 | A1 | 10/2015 | Yu et al. |
| 2016/0372533 | A1 | 12/2016 | Kim et al. |
| 2018/0164485 | A1 | 6/2018 | Xu |
| 2019/0146147 | A1 | 5/2019 | Nakamori |
| 2019/0355765 | A1 | 11/2019 | Li et al. |
| 2020/0052033 | A1 | 2/2020 | Iguchi |
| 2020/0089281 | A1 | 3/2020 | Ma et al. |
| 2021/0223622 | A1* | 7/2021 | Kamijo ............. G02F 1/133615 |
| 2021/0223630 | A1 | 7/2021 | Ma et al. |
| 2022/0059479 | A1* | 2/2022 | Shin ....................... H05K 1/189 |
| 2022/0406875 | A1 | 12/2022 | Zhang et al. |
| 2023/0134900 | A1* | 5/2023 | Fan ...................... G09G 3/3225 345/214 |
| 2023/0143518 | A1 | 5/2023 | Li |

FOREIGN PATENT DOCUMENTS

| | | | |
|---|---|---|---|
| CN | 101086995 | A | 12/2007 |
| CN | 102540593 | A | 7/2012 |
| CN | 103543559 | A | 1/2014 |
| CN | 106405935 | A | 2/2017 |
| CN | 106597713 | A | 4/2017 |
| CN | 107102477 | A | 8/2017 |
| CN | 108363240 | A | 8/2018 |
| CN | 207781596 | U | 8/2018 |
| CN | 108828841 | A | 11/2018 |
| CN | 108878453 | A | 11/2018 |
| CN | 208077535 | U | 11/2018 |
| CN | 208596273 | U | 3/2019 |
| CN | 110412802 | A | 11/2019 |
| CN | 210575035 | U | 5/2020 |
| CN | 111752407 | A | 10/2020 |
| CN | 111812888 | A | 10/2020 |
| CN | 111933674 | A | 11/2020 |
| JP | 2018067505 | A | 4/2018 |

OTHER PUBLICATIONS

Extended European Search Report, mailed Aug. 14, 2023, from EP App. No. 20966584.3, 8 pages.

* cited by examiner

DRIVE BACKPLANE AND DISPLAY APPARATUS

CROSS-REFERENCE TO RELATED APPLICATIONS

This application is a US National Stage of International Application No. PCT/CN2020/139494, filed Dec. 25, 2020, the entire contents of which are hereby incorporated by reference.

FIELD

The present disclosure relates to the technical field of display, in particular to a drive backplane and a display apparatus.

BACKGROUND

With the continuous development of a light emitting diode (LED) technology, the size of a Mini light emitting diode (Mini LED) has been miniaturized to 100 microns to 300 microns. More careful local dimming can be performed when thousands, tens of thousands or even more Mini LED beads are fixed on a drive backplane, so that a display image with a high contrast and a high color representation can be presented.

Since the layout of the Mini LEDs fixed on the drive backplane is very dense, in order to apply signals to each Mini LED, a large quantity of signal lines need to be set on the drive backplane. However, in order to connect each signal line to a binding region, a fan-out region needs to be set for take-up, which occupies a wiring space of the drive backplane and increases a bezel of a display apparatus.

SUMMARY

Embodiments of the present disclosure provide a drive backplane, including:

- a base substrate;
- a plurality of binding electrodes, located in a binding region on the base substrate;
- a plurality of signal lines, located on the base substrate, wherein the plurality of signal lines extend in a second direction and are arranged in a first direction, the first direction and the second direction intersect with each other, and at least two signal lines among the plurality of signal lines have different lengths in the second direction; and
- a plurality of fan-out lines, located on the base substrate, wherein at least one fan-out line among the plurality of fan-out lines includes a connection line portion, an extension direction of which forms a certain included angle with the second direction, and a first straight line portion extending in the second direction; one end of the connection line portion is coupled to one end of the signal line close to the binding electrode, and the other end of the connection line portion is coupled to the first straight line portion; one end of the first straight line portion away from the connection line portion is coupled to the binding electrode;
- a distance, in a direction perpendicular to the first direction, between the two ends of the connection line portion is a first distance; and the first distances of at least two connection line portions are different.

Optionally, in the embodiments of the present disclosure, the drive backplane includes two first side edges which extend in the second direction and are oppositely arranged, and the drive backplane has a first axis extending in the second direction between the two first side edges.

At least two signal lines exist, and a length of the signal line close to the first side edge is greater than a length of the signal line close to the first axis.

At least two fan-out lines exist, and a first distance of a connection line portion of the fan-out line close to the first side edge is smaller than a first distance of a connection line portion of the fan-out line close to the first axis.

Optionally, in the embodiments of the present disclosure, the connection line portions are symmetrically distributed with respect to the first axis.

Optionally, in the embodiments of the present disclosure, the drive backplane includes a plurality of light emitting regions arranged in an array in the first direction and the second direction.

The plurality of signal lines are divided into a plurality of signal line groups. Each signal line group includes a plurality of signal lines coupled to at least one row of light emitting regions arranged in the second direction.

A difference between the first distances of different connection line portions coupled to signal lines in the same signal line group is smaller than a set value, and a difference between the first distances of different connection line portions coupled to signal lines in different signal line groups is greater than the set value.

Optionally, in the embodiments of the present disclosure, a width of at least one signal line among the plurality of signal lines is greater than a width of the fan-out line.

Optionally, in the embodiments of the present disclosure, at least one fan-out line among the plurality of fan-out lines further includes: a second straight line portion extending in the second direction.

One end of the second straight line portion is coupled to one end of the signal line close to the binding electrode, and the other end of the second straight line portion is coupled to one end of the connection line portion away from the first straight line portion.

Optionally, in the embodiments of the present disclosure, the drive backplane further includes: a plurality of first contact electrode groups and a plurality of second contact electrode groups located on the base substrate. Each light emitting region is provided with a first contact electrode group and at least three second contact electrode groups. Each first contact electrode group includes: a plurality of first contact electrodes configured to be coupled to pins of a pixel drive chip. Each second contact electrode group includes: two second contact electrodes configured to be coupled to electrodes of a light emitting diode.

The signal lines are located between a film layer where the second contact electrodes are located and the base substrate.

Orthographic projections of the second contact electrodes on the base substrate are located within a range of an orthographic projection of at least one signal line among the plurality of signal lines on the base substrate.

Optionally, in the embodiments of the present disclosure, in at least two adjacent signal lines among the plurality of signal lines, one of which has a convex portion facing the other signal line, and the other one of which has a concave portion corresponding to the convex portion.

The orthographic projections of the second contact electrodes on the base substrate are located within a range of an orthographic projection of the same signal line on the base substrate.

Optionally, in the embodiments of the present disclosure, the plurality of signal lines include: a plurality of first power signal lines, a plurality of second power signal lines, a plurality of fixed voltage signal lines and a plurality of addressing signal lines.

The first power signal lines are coupled to the second contact electrodes in a row of the light emitting regions arranged in the second direction.

The second power signal lines are coupled to the first contact electrodes in a row of the light emitting regions arranged in the second direction.

The fixed voltage signal lines are coupled to the first contact electrodes in a row of the light emitting regions arranged in the second direction.

The addressing signal lines are coupled to the first contact electrodes in two adjacent rows of the light emitting regions arranged in the second direction.

Optionally, in the embodiments of the present disclosure, the plurality of light emitting regions are divided into a plurality of light emitting region groups. Each light emitting region group includes two adjacent rows of the light emitting regions arranged in the second direction.

In one row of the light emitting regions of the light emitting region group, the first contact electrode group is located in a partial region in the light emitting region away from the binding electrode; and in the other row of the light emitting regions of the light emitting region group, the first contact electrode group is located in a partial region in the light emitting region close to the binding region.

Optionally, in the embodiments of the present disclosure, the drive backplane further includes: a plurality of connecting lines located on a film layer between the signal lines and the first contact electrodes.

Part of the plurality of connecting lines are configured to connect the signal lines with the first contact electrodes, part of the plurality of connecting lines are configured to connect the signal lines with the second contact electrodes, part of the plurality of connecting lines are configured to connect the first contact electrodes with the second contact electrodes, part of the plurality of connecting lines are configured to connect two first contact electrodes, and part of the plurality of connecting lines are configured to connect two second contact electrodes.

At least part of the plurality of connecting lines include: a first connecting portion extending in the first direction and a second connecting portion extending in the second direction.

Optionally, in the embodiments of the present disclosure, a position where the first connecting portion is connected with the second connecting portion has a fillet setting.

Optionally, in the embodiments of the present disclosure, the drive backplane further includes: an inorganic insulating layer located on one side of the connecting lines facing away from the base substrate.

A thickness of the inorganic insulating layer is greater than 2000 Å.

Accordingly, embodiments of the present disclosure further provide a display apparatus, including: any above drive backplane, and a plurality of pixel drive chips and a plurality of light emitting diodes which are coupled to the drive backplane.

DETAILED DESCRIPTION OF THE EMBODIMENTS

Embodiments of the present disclosure provide a drive backplane and a display apparatus.

The implementations of the drive backplane and the display apparatus provided by the embodiments of the present disclosure are illustrated in detail below in conjunction with the accompanying drawings. The thickness and shape of each film layer in the accompanying drawings do not reflect a true scale, and are only intended to schematically illustrate the contents of the present disclosure.

Figure 1:
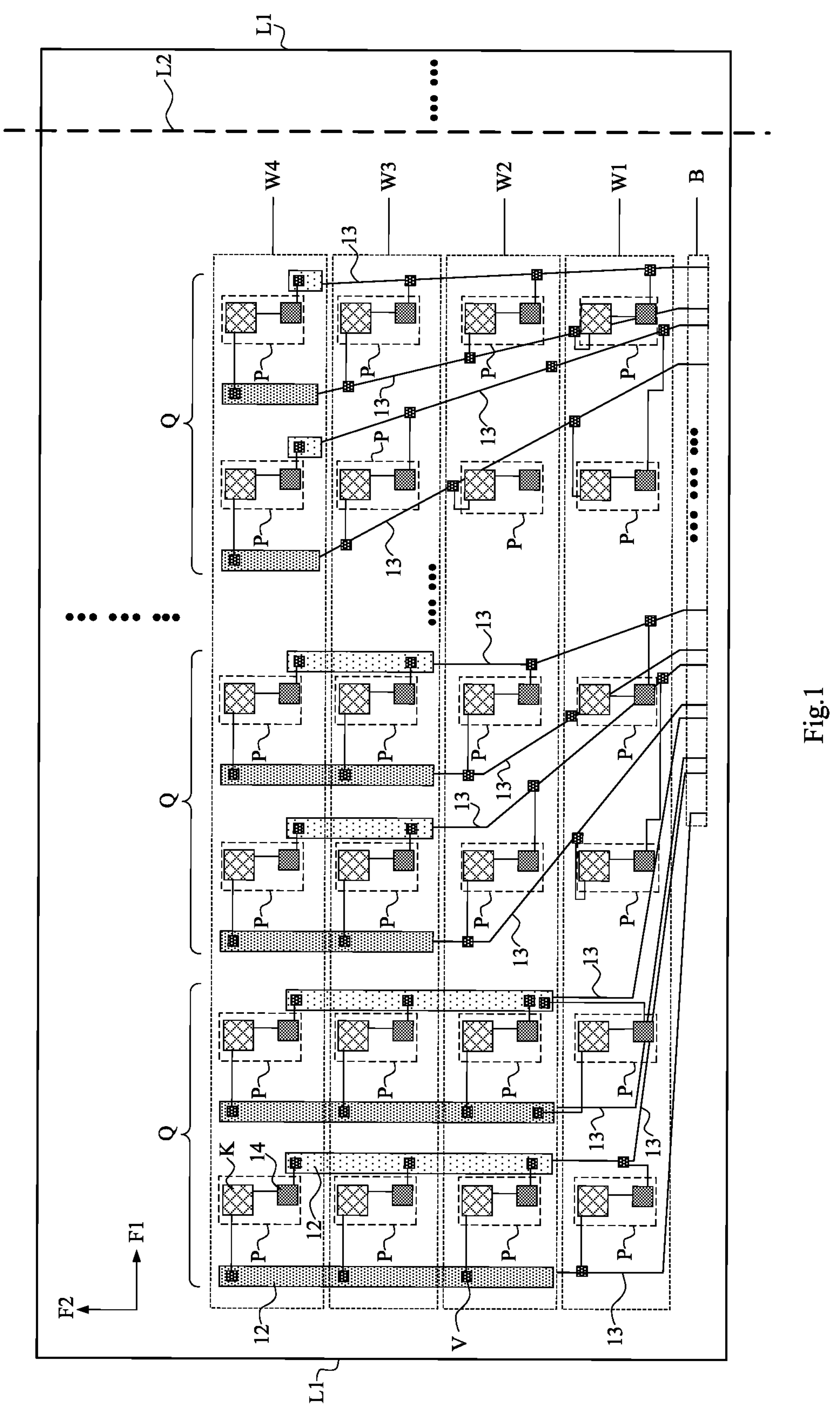
FIG. 1 is a schematic planar structural diagram of a drive backplane provided by an embodiment of the present disclosure.

FIG. 1 is a schematic planar structural diagram of a drive backplane provided by an embodiment of the present disclosure. As shown in FIG. 1, the drive backplane provided by the embodiment of the present disclosure may include: a plurality of strip-shaped lamp regions (such as lamp regions W1, W2, W3 and W4 in FIG. 1) which extend in a first direction F1 and are arranged in a second direction F2, and a binding region B. The first direction F1 and the second direction F2 intersect with each other.

Figure 2:
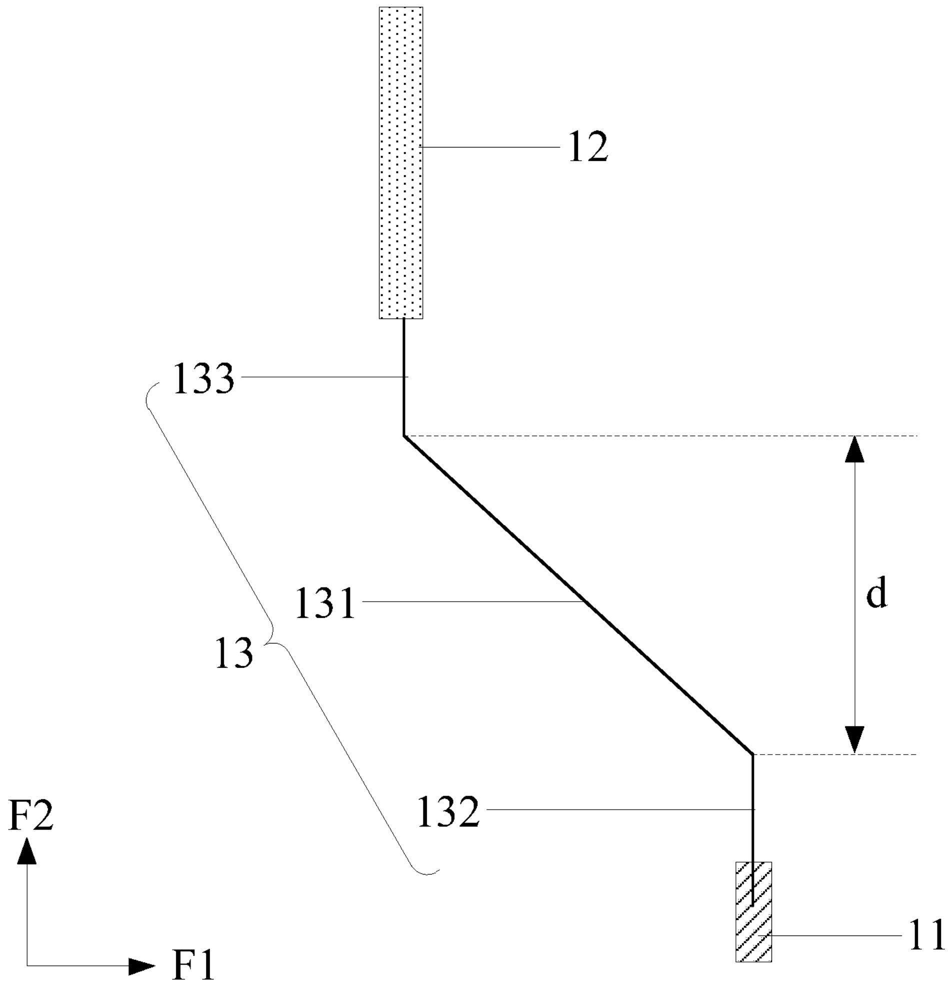
FIG. 2 is a partially enlarged schematic diagram of a drive backplane provided by an embodiment of the present disclosure.

FIG. 2 is a partially enlarged schematic diagram of a drive backplane provided by an embodiment of the present disclosure. In combination with FIG. 1 and FIG. 2, the above drive backplane may further include:

- a base substrate (not shown in the figure);
- a plurality of binding electrodes 11, located in the binding region B on the base substrate;
- a plurality of signal lines 12, located on the base substrate, wherein the plurality of signal lines 12 extend in the second direction F2 and are arranged in the first direction F1; the first direction F1 and the second direction F2 intersect with each other, and at least two signal lines 12 among the plurality of signal lines 12 have different lengths in the second direction F2; and for example, in FIG. 1, a first signal line 12 and a second signal line 12 counted from the leftmost side both extend in the second direction F2, and overlap the lamp regions W2, W3 and W4, and moreover, lengths of the two signal lines 12 are different; and a plurality of fan-out lines 13, located on the base substrate, wherein at least one fan-out line 13 among the plurality of fan-out lines 13 includes a connection line portion 131, an extension direction of which forms a certain included angle with the second direction F2, and a first straight line portion 132 extending in the second direction F2; one end of the connection line portion 131 is coupled to one end of the signal line 12 close to the binding electrode 11, and the other end of the connection line portion 131 is coupled to the first straight line portion 132; one end of the first straight line portion 132 away from the connection line portion 131 is coupled to the binding electrode 11.

A distance, in a direction perpendicular to the first direction F1, between the two ends of the connection line portion 131 is a first distance d. The first distances d of at least two connection line portions 131 are different.

In the drive backplane provided by the embodiments of the present disclosure, the fan-out lines are arranged for coupling the signal lines to the corresponding binding electrodes. Moreover, there are at least two signal lines having different lengths in the second direction, and there are at least two connection line portions having different first distances, so that the fan-out lines overlap at least one lamp region, a space of the lamp regions is fully utilized, and a fan-out region does not need to be set separately for take-up, which increases a wiring space of the drive backplane and reduces a bezel of a display apparatus.

Referring to FIG. 1, in a light emitting diode display apparatus, each lamp region is provided with a plurality of light emitting diodes. The light emitting diodes are coupled to at least one signal line 12. The binding region B is generally located at an edge position of the drive backplane. The binding region B includes a plurality of binding electrodes. The binding electrodes may be bound and connected with elements such as a drive chip or a flexible printed circuit. In addition, the binding electrodes are coupled to the signal lines through the fan-out lines. Therefore, signals may be applied to the signal lines through the drive chip or the flexible printed circuit, so as to control the light emitting diodes to emit light. The quantity and sizes of the binding electrodes in the binding region B need to match with the elements such as the drive chip or the flexible printed circuit. In order to make the display apparatus light and thin and realize a narrow bezel of the display apparatus, the sizes of the elements such as the drive chip or the flexible printed circuit are generally set as small as possible, so a width of the binding region B is usually smaller than a side width of the drive backplane.

Further referring to FIG. 1, the signal lines 12 extend in the second direction F2. Moreover, in order to meet an electrical transmission capability and stability of the drive backplane for the signal lines 12, each signal line 12 has a certain width. Further, a width size of each binding electrode in the binding region is much smaller than the line width of the signal line. Therefore, the signal lines 12 cannot be directly connected to the binding region B with an unchanged width. In the embodiments of the present disclosure, the plurality of fan-out lines 13 are set. Each fan-out line 13 includes a connection line portion and a first straight line portion. Therefore, the signal lines 12 may be connected with the binding electrodes in the binding region B through the fan-out lines 13. In addition, there are at least two signal lines 12 having different lengths in the second direction F2, and there are connection line portions of at least two fan-out lines 13 having different first distances, so that the fan-out lines 13 overlap at least one lamp region, the space of the lamp regions is fully utilized, and a fan-out region does not need to be separately set for take-up. In addition, in order to further utilize the wiring space of the drive backplane, a width of one end of the connection line portion 131 away from the binding electrode 11 may be set to be greater than a width of another end of the connection line portion 131 close to the binding electrode 11. Moreover, the width of the end of the connection line portion 131 close to the binding electrode 11 may be set to be greater than a width of the first straight line portion 132.

In practical applications, in the above drive backplane provided by the embodiments of present disclosure, as shown in FIG. 1 and FIG. 2, at least one fan-out line 13 among the plurality of fan-out lines may further include: a second straight line portion 133 extending in the second direction F2.

One end of the second straight line portion 133 is coupled to one end of the signal line 12 close to the binding electrode 11, and the other end of the second straight line portion 133 is coupled to one end of the connection line portion 131 away from the first straight line portion 132.

By setting the second straight line portion 133, a length and an inclination of the connection line portion 131 in each fan-out line 13 may be adjusted, so that each signal line 12 may be coupled to the corresponding binding electrode 11 through the corresponding fan-out line 13. In addition, a certain distance may be kept between adjacent fan-out lines 13 to avoid the intersection between the adjacent fan-out lines 13, so that the wiring space of the lamp regions may be utilized more reasonably, and the reliability of an electrical connection path is ensured.

During implementations, in the above drive backplane provided by the embodiments of present disclosure, as shown in FIG. 1 and FIG. 2, the drive backplane includes two first side edges L1 which extend in the second direction F2 and are oppositely arranged, and the drive backplane has a first axis L2 extending in the second direction F2 between the two first side edges L1.

There are at least two signal lines 12, a length of the signal line 12 close to the first side edge L1 is greater than a length of the signal line 12 close to the first axis L2. For example, in FIG. 1, a length of a signal line 12 on the leftmost side is greater than a length of a signal line 12 on the rightmost side.

There are at least two fan-out lines 13, a first distance of the connection line portion of the fan-out line 13 close to the first side edge L1 is smaller than a first distance of the connection line portion of the fan-out line 13 close to the first axis L2. For example, in FIG. 1, a first distance of the connection line portion of a fan-out line 13 on the leftmost side is smaller than a first distance of the connection line portion of a fan-out line 13 on the rightmost side.

In some embodiments, in a direction from the first side edges L1 pointing to the first axis L2, the length of each signal line 12 tends to decrease gradually, and the first distance d of the connection line portion 131 of each fan-out line 13 tends to increase gradually. The gradually decreasing trend includes a case where a size relationship includes smaller than or equal to, and the gradually increasing trend includes a case where the size relationship includes greater than or equal to.

That is, at a position where the length of the signal line 12 is large, the first distance of the connection line portion 131 is short. Therefore, the intersection among the fan-out lines 13 may be avoided. It is ensured that each signal line 12 can be connected to the binding region B through the fan-out lines 13, and the space of the lamp regions may be utilized more reasonably.

Further, in the drive backplane provided by the embodiments of the present disclosure, also referring to FIG. 1 and FIG. 2, the connection line portions 131 are symmetrically distributed with respect to the first axis L2. That is, the first axis L2 may be a central axis of the drive backplane, and the fan-out lines 13 are set to be symmetrically distributed, so that the signal lines 12 may be connected to the binding region B through the fan-out lines 13. There will be no intersection among the fan-out lines 13, and the space of the lamp regions is fully utilized.

It should be noted that in the embodiments of the present disclosure, the connection line portions being symmetrically distributed with respect to the first axis means that the first distances of two symmetrical connection line portions are approximately equal. That is, a difference between the first distances of the two symmetrical connection line portions is within a certain range. Of course, in an actual wiring process, the fan-out lines 13 in the drive backplane may also be set to be asymmetrically distributed and may set according to an actual wiring situation, which is not limited here.

In some embodiments, in the above drive backplane provided by the embodiments of the present disclosure, as shown in FIG. 1 and FIG. 2, the drive backplane includes a plurality of light emitting regions P arranged in an array in the first direction F1 and the second direction F2.

The lamp region includes a plurality of light emitting regions P arranged in the first direction F1.

The plurality of signal lines may be divided into a plurality of signal line groups (for example, in FIG. 1, signal lines 12 corresponding to one brace Q form a signal line group). Each signal line group Q at least includes a plurality of signal lines coupled to at least one row of light emitting regions P arranged in the second direction F2. In FIG. 1, a situation that each signal line group Q includes a plurality of signal lines coupled to two rows of light emitting regions P arranged in the second direction F2 is taken as an example for illustration. During implementations, each signal line group Q may also include a plurality of signal lines coupled to three, four or more rows of light emitting regions P, which is not limited here.

A difference between the first distances of different connection line portions 131 coupled to signal lines 12 in the same signal line group Q is smaller than a set value, and a difference between the first distances of different connection line portions 131 coupled to signal lines 12 in different signal line groups Q is greater than the set value. For example, the set value may be a width of a lamp region in the second direction F2 or one half of the width of the lamp region in the second direction F2, which may be set according to the actual situation. That is, in the same signal line group Q, the first distances of the connection line portions 131 coupled to the signal lines 12 are approximately equal, while the difference between the first distances of different connection line portions 131 coupled to the signal lines 12 in different signal line groups Q is large.

For example, in FIG. 1, in a first signal line group Q on the left side, the first distances of the connection line portions 131 coupled to the signal lines 12 are all smaller than the width of one lamp region in the second direction F2. In a second signal line group Q on the left side, the first distances of the connection line portions 131 coupled to the signal lines 12 are all greater than the width of one lamp region in the second direction F2, and smaller than twice the width of the lamp region in the second direction F2. That is, a difference between the first distance of the connection line portion 131 coupled to any signal line 12 in the first signal line group Q on the left side and the first distance of the connection line portion 131 coupled to any signal line 12 in the second signal line group Q on the left side is greater than the width of one lamp region in the second direction F2. In this way, the first distances of the connection line portions 131 of the fan-out lines 13 coupled to the signal lines 12 in the same signal line group Q are approximately equal, which is more conducive to the wiring of the drive backplane and makes the wiring in the drive backplane more regular.

In applications, in the above drive backplane provided by the embodiments of the present disclosure, as shown in FIG. 1, a width of at least one signal line 12 among the plurality of signal lines 12 is greater than a width of the fan-out line 13. The line width of the signal line 12 is set to be large, so that a resistance of the signal line 12 may be reduced, a phenomenon of signal delay is avoided, and the performance of the drive backplane is improved.

In addition, the binding region B is generally set at a middle position of an edge of the drive backplane. Therefore, the closer the signal lines 12 to the first side edges L1, the farther they are from the binding region B. If the widths of the signal lines 12 and the fan-out lines 13 are the same, the difference between a resistance sum of the signal lines 12 close to the first side edges L1 and the fan-out lines 13 and a resistance sum of the signal lines 12 close to the middle position and the fan-out lines 13 is large, which is prone to signal delay, and poor effects of uneven display brightness and the like are caused. In the embodiments of the present disclosure, the width of each signal line 12 is enlarged. Moreover, there are at least two signal lines 12, the length of the signal line 12 close to the first side edge L1 is greater than the length of the signal line 12 close to the first axis L2. Thus a resistance difference between different channels (each channel corresponds to interconnected signal lines 12 and fan-out lines 13) may be reduced, and the signal delay amount is reduced, thereby further improving the performance of the drive backplane.

In order to keep a resistance ratio between the channels within a preset range to reduce the signal delay situation, in the embodiments of the present disclosure, the following methods may be at least adopted to realize an equal resistance design of each channel.

Figure 3:
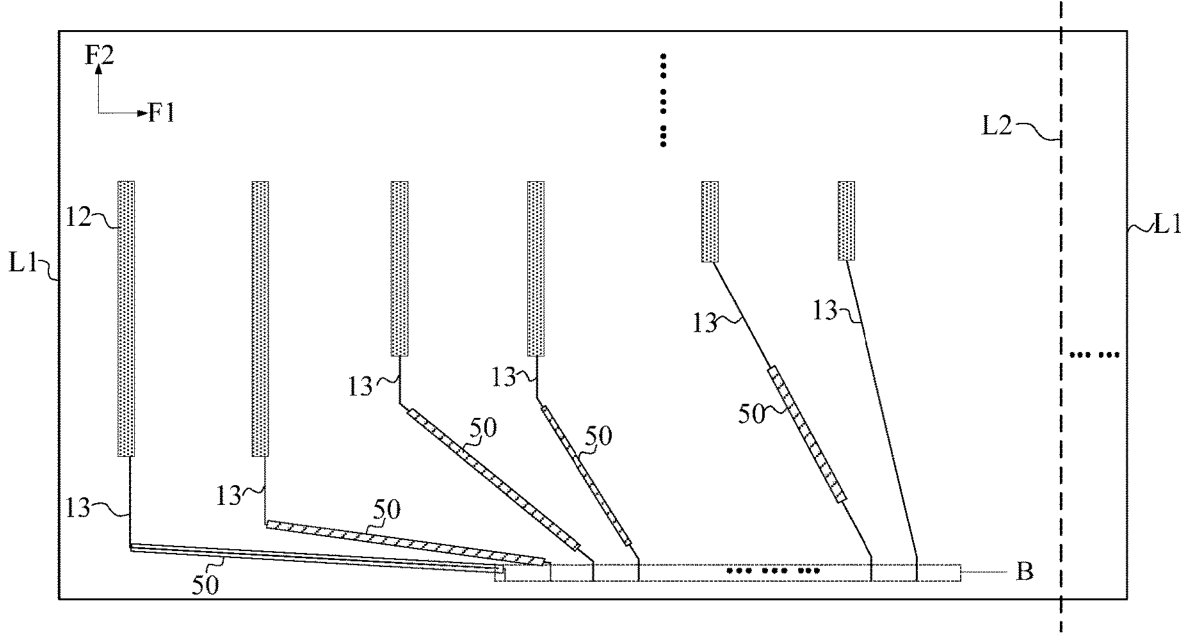
FIG. 3 is another schematic planar structural diagram of a drive backplane provided by an embodiment of the present disclosure.

FIG. 3 is another schematic planar structural diagram of a drive backplane provided by an embodiment of the present disclosure. As shown in FIG. 3, an auxiliary connecting line 50 is at least set at a position close to the first side edge L1. The auxiliary connecting line 50 and the corresponding fan-out line 13 form a double-layer parallel line. For example, the auxiliary connecting lines 50 may be set at the positions where the connection line portions of the corresponding fan-out lines 13 are located. In addition, in order to prevent the auxiliary connecting lines 50 from occupying the wiring space, the auxiliary connecting lines 50 may be set in different layers with the fan-out lines 13. In order to save a production cost, the auxiliary connecting lines 50 may be set in the same layer with other film layers in the drive backplane.

In order to further reduce the resistance difference of each channel, the auxiliary connecting line(s) 50 may be set at the position close to the first side edge L1, while no auxiliary connecting line 50 is set at the position close to the first axis L2. That is, the fan-out lines 13 at the middle position are single-layer lines. Moreover, in a direction each first side edge L1 pointing to the first axis L2, a length of each auxiliary connecting line 50 gradually decreases.

Figure 4:
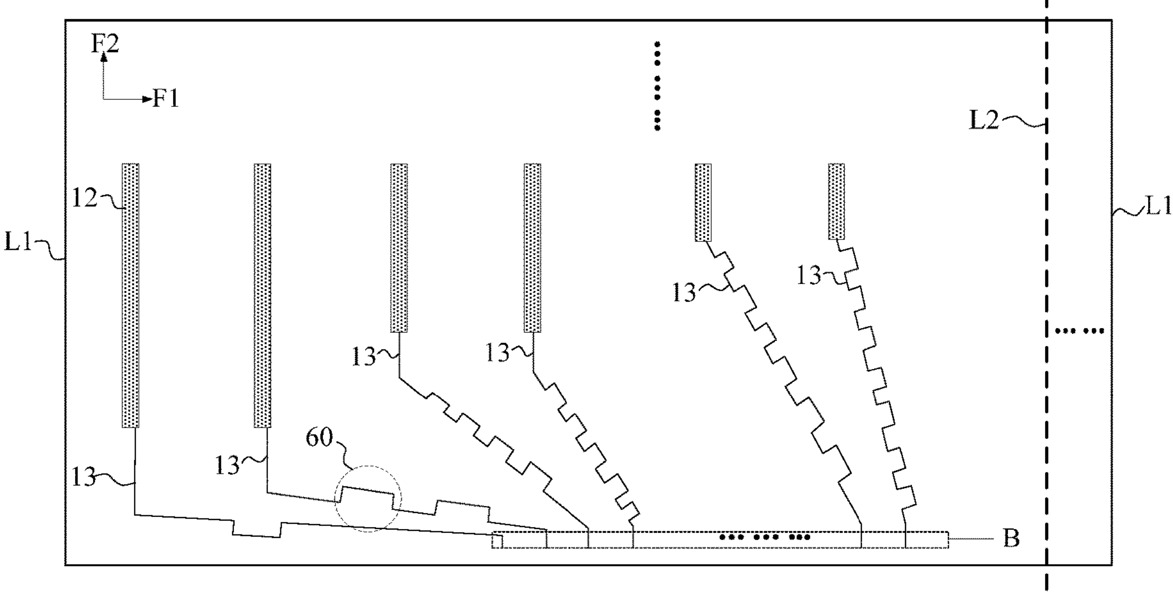
FIG. 4 is another schematic planar structural diagram of a drive backplane provided by an embodiment of the present disclosure.

FIG. 4 is another schematic planar structural diagram of a drive backplane provided by an embodiment of the present disclosure. As shown in FIG. 4, a broken line structure 60 is at least set in the fan-out line 13 close to the first axis L2. Moreover, in a direction the first axis L2 pointing to each first side edge L1, the broken line structure 60 included in each fan-out line 13 gradually decreases. For example, it may be that the quantity of the broken line structure 60 gradually decreases, or a size of the broken line structure 60 gradually decreases. In addition, the broken line structure 60 may be set at position of the connection line portion, the first straight line portion or the second straight line portion in the fan-out line 13.

It should be noted that FIG. 4 is only intended to illustrate an approximate position of the broken line structure 60, and does not limit the size and shape of the fan-out line 13.

In the embodiments of the present disclosure, the equal resistance design of each channel is illustrated by taking the above method 1 and method 2 as examples. During implementations, in order to make the resistance of each connecting line consistent, the above method 1 and method 2 may also be combined, or other methods may also be adopted, as long as the resistance of each channel can be consistent, which is not limited here.

Figure 5:
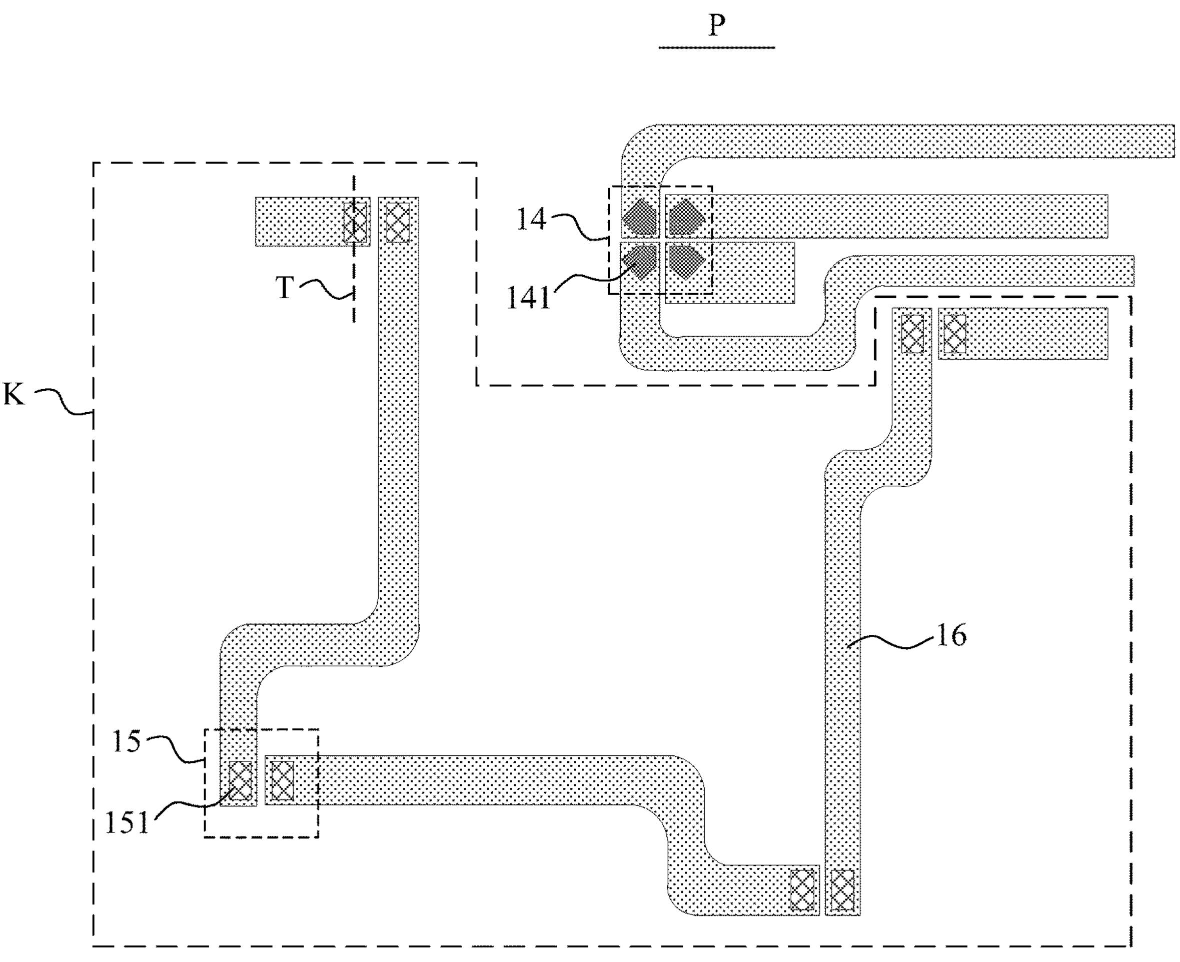
FIG. 5 is a partially enlarged schematic diagram of a light emitting region in an embodiment of the present disclosure.

The above drive backplane provided by the embodiments of the present disclosure, as shown in FIG. 1, may further include: a plurality of first contact electrode groups 14 and a plurality of second contact electrode groups which are located on the base substrate (a region K in FIG. 1 represents a region where each second contact electrode group in a light emitting region P is located). FIG. 5 is a partially enlarged schematic diagram of one light emitting region in the embodiments of the present disclosure, in combination with FIG. 1 and FIG. 5, each light emitting region P is provided with a first contact electrode group 14 and at least three second contact electrode groups 15. The first contact electrode group 14 includes a plurality of first contact electrodes 141 configured to be coupled to pins of a pixel drive chip. The second contact electrode group 15 includes: two second contact electrodes 151 configured to be coupled to electrodes of a light emitting diode. In addition, in each light emitting region P, the second contact electrode groups 15 are coupled through a connecting line 16.

In some embodiments, there is a cascading relationship among a plurality of pixel drive chips that are in one-to-one correspondence to and are bound and connected with a plurality of first contact electrode groups 14 in the same signal line group Q.

In an actual process, after the drive backplane is manufactured, the pixel drive chips are bound to the positions of the first contact electrode groups 14, the pins of the pixel drive chips are coupled to the first contact electrodes 141, the light emitting diode is bound to the positions of the second contact electrode groups 15, and the electrodes of the light emitting diode are coupled to the second contact electrodes 151. It may be understood that light emitting diodes of different colors connected in parallel are bound into the same light emitting region P, thereby achieving color display.

In FIG. 5, a situation that each light emitting region P is provided with four second contact electrode groups 15 is taken as an example for illustration. During implementations, the quantity of the second contact electrode groups 15 in each light emitting region P may be set according to actual needs, which is not limited here.

Figure 6:
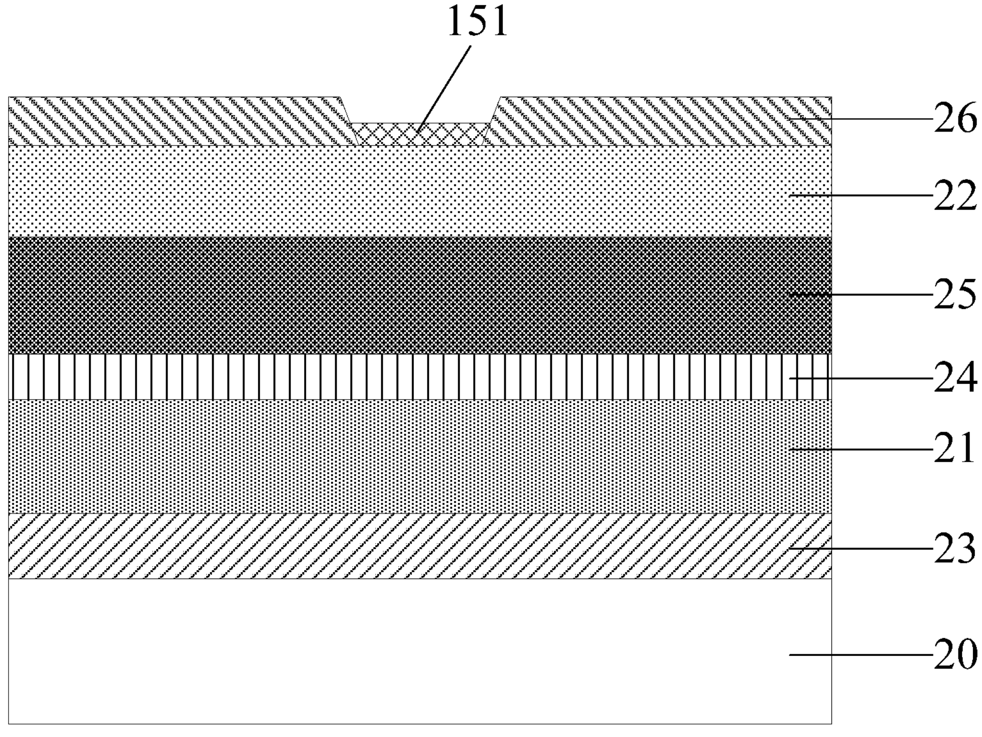
FIG. 6 is a schematic diagram of a film layer structure of a drive backplane in an embodiment of the present disclosure.
Figure 7:
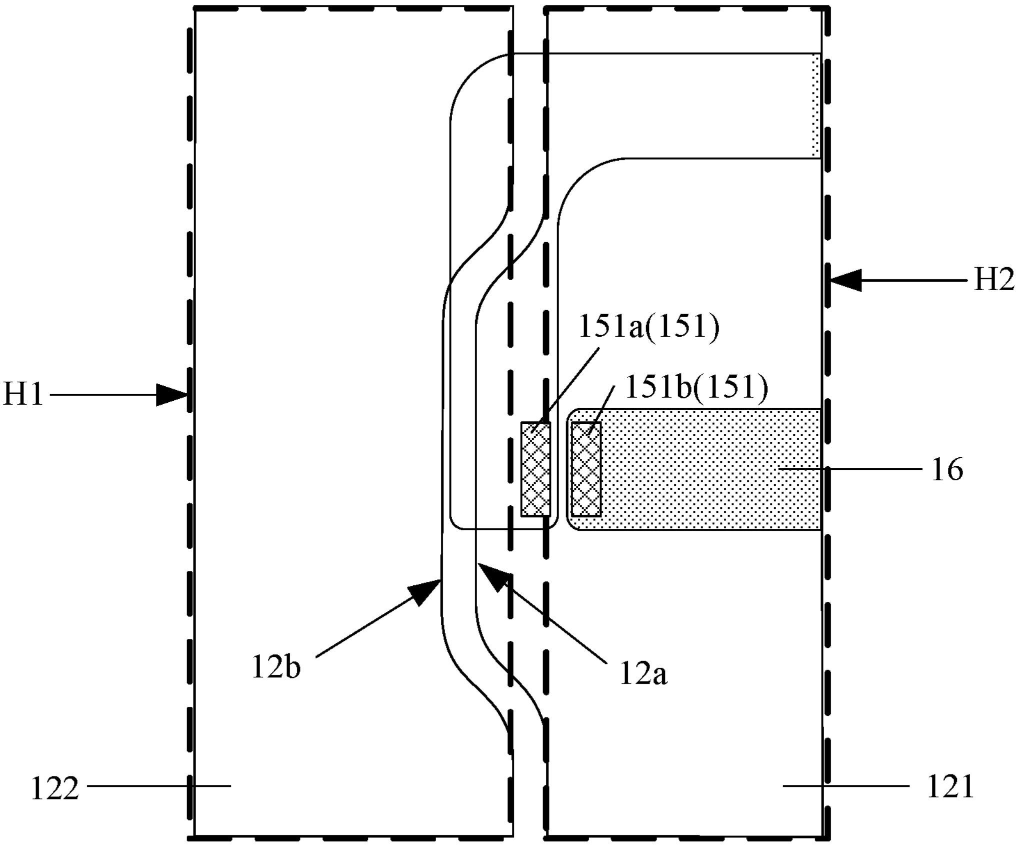
FIG. 7 is a partially enlarged schematic diagram of a drive backplane in an embodiment of the present disclosure.

FIG. 6 is a schematic sectional view of FIG. 5 at a dotted line T. As shown in FIG. 6, the signal lines (a film layer 21 in FIG. 6) are located between a film layer where the second contact electrodes 151 are located and the base substrate 20. In the embodiments of the present disclosure, the first contact electrodes and the second contact electrodes may be located on the same film layer to save a production process. FIG. 7 is a partially enlarged schematic diagram of a drive backplane in an embodiment of the present disclosure. In combination with FIG. 6 and FIG. 7, orthographic projections of the second contact electrodes 151 on the base substrate 20 are located within a range of an orthographic projection of at least one signal line 12 among the plurality of signal lines 12 on the base substrate 20. In this way, the signal lines 12 are set below the second contact electrodes 151 respectively, and the situation that there is a segment difference between the two second contact electrodes 151 in one second contact electrode group, leading to an uneven surface of the second contact electrodes 151 to be bound and connected to the light emitting diode, thereby affecting a light emitting direction of the light emitting diode, the reliability of the binding and a display effect is avoided.

In the above drive backplane provided by the embodiments of the present disclosure, as shown in FIG. 7, in at least two adjacent signal lines 12 among the plurality of signal lines 12, one of which (such as a signal line 12 on the right side in FIG. 7) has a convex portion **12*a* facing the other signal line, and the other one of which (such as a signal line 12 on the left side in FIG. 7) has a concave portion 12*b* corresponding to the convex portion 12*a*. Therefore, the orthographic projections of the second contact electrodes 151 on the base substrate are all located within the range of the orthographic projection of the same signal line 121 on the base substrate. Therefore, it is avoided that one part of the orthographic projections of the second contact electrodes 151 on the base substrate is within the range of the orthographic projections of the signal lines on the base substrate, and the other part is located between two adjacent signal lines. Dotted boxes H1 and H2 in FIG. 7 represent outlines of two adjacent signal lines without convex and concave portions, and each second contact electrode 151 includes two sub-electrodes 151*a* and 151*b*. It can be clearly seen that an orthographic projection of the second contact electrode 151*a* on the base substrate is located in a gap between the two signal lines. Thus the shape of a region corresponding to the signal line 121 having a largest overlapping area with the second contact electrode 151 is adjusted, and the shape of the signal line 122 closest to the signal line 121 is adaptively adjusted, so that it is ensured that the second contact electrode 151 is above a pattern of the same signal line 121, surfaces of all regions of the second contact electrode 151 are flatter, the reliability of the light emitting diode bound and connected to the second contact electrode 151** is better, and the light emitting direction of the light emitting diode cannot be affected. In addition, although the two adjacent signal lines have a concave portion and a convex portion respectively, the spacing of the two signal lines at each position is approximately the same, and thus, the setting of the convex portion and the concave portion cannot generate an electrical interference between the signal lines.

Figure 8:
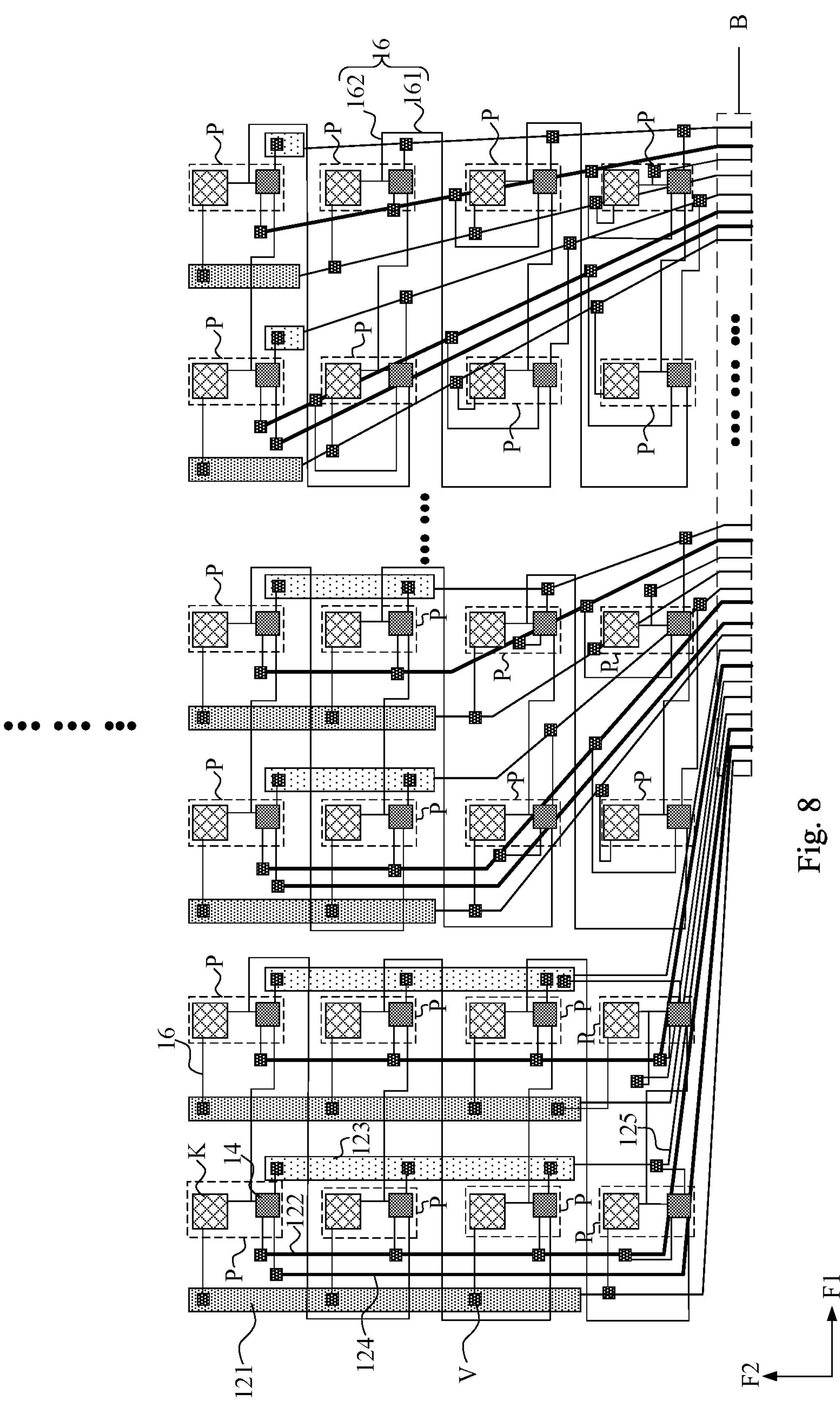
FIG. 8 is another schematic planar structural diagram of a drive backplane provided by an embodiment of the present disclosure.

FIG. 8 is another schematic planar structural diagram of a drive backplane provided by an embodiment of the present disclosure. As shown in FIG. 8, in the above drive backplane provided by the embodiments of the present disclosure, the plurality of signal lines may include: a plurality of first power signal lines 121, a plurality of second power signal lines 122, a plurality of fixed voltage signal lines 123 and a plurality of addressing signal lines 124.

The first power signal lines 121 are coupled to the second contact electrodes (located in a region K in FIG. 8) in a row of the light emitting regions P arranged in the second direction F2.

The second power signal lines 122 are coupled to the first contact electrodes (located in the first contact electrode group 14) in a row of the light emitting regions P arranged in the second direction F2.

The fixed voltage signal lines 123 are coupled to the first contact electrodes in a row of the light emitting regions P arranged in the second direction F2.

The addressing signal lines 124 are coupled to the first contact electrodes in two adjacent rows of the light emitting regions P arranged in the second direction F2.

Figure 9:
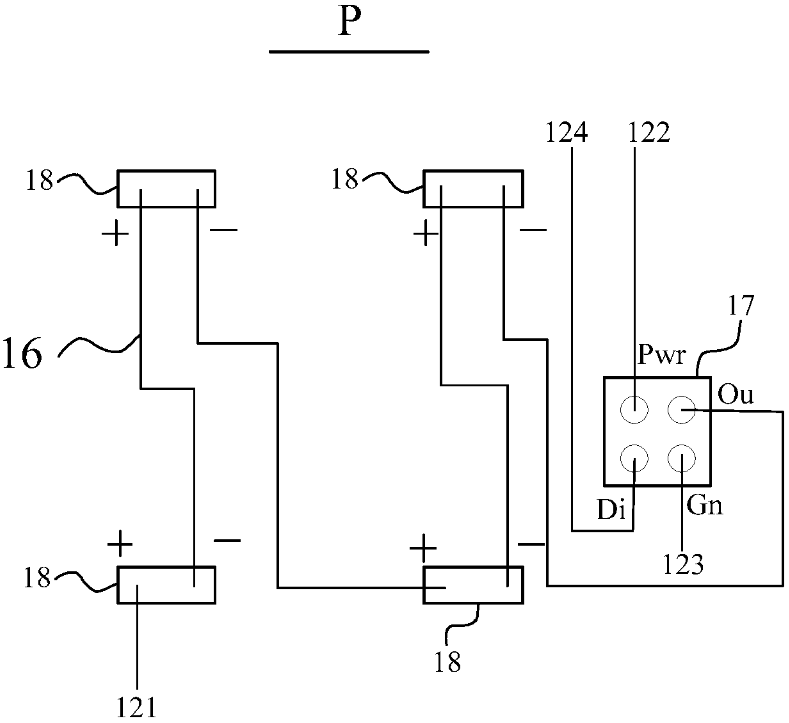
FIG. 9 is a schematic diagram of a connection relationship within a light emitting region in an embodiment of the present disclosure.

FIG. 9 is an equivalent circuit diagram of the light emitting region shown in FIG. 5. Moreover, in order to illustrate a connection relationship of the respective signal lines, FIG. 9 illustrates a connection relationship after the drive backplane is bound to the light emitting diode and a pixel driving circuit. In combination with FIG. 8 and FIG. 9, the pixel drive chip 17 may include a first input end Di, a second input end pwr, an output end Ou and a common voltage end Gn. The light emitting diodes 18 in the light emitting region P are sequentially connected in series. Moreover, a first light emitting diode 18 connected in series is connected with the first power signal lines 121, the last light emitting diode 18 connected in series is connected with the output end Ou of the pixel drive chip 17, and power may be supplied to each light emitting diode 18 in the light emitting region P through the first power signal lines 121. The first power signal lines 121 are coupled to one row of the light emitting regions P arranged in the second direction F2, which may supply power to the light emitting diodes 18 in the one row of the light emitting regions P. The second power signal lines 122 are connected with the second input end pwr of the pixel drive chip 17, and power may be supplied to the pixel drive chip 17 through the second power signal lines 121. The second power signal lines 122 are coupled to one row of the light emitting regions P arranged in the second direction F2, which may supply power to the pixel drive chip 17 in the one row of the light emitting regions P. The fixed voltage signal lines 123 are connected with the common voltage end Gn of the pixel drive chip 17, and common voltage signals are supplied to the pixel drive chip 17 through the fixed voltage signal lines 123. For example, the common voltage signals may be grounding signals. The fixed voltage signal lines 123 are coupled to one row of the light emitting regions P arranged in the second direction F2, which may supply common voltage signals to the pixel drive chip 17 in the one row of the light emitting regions P. The addressing signal lines 124 are connected with the first input end Di of the pixel drive chip 17. The addressing signal lines 124 may transmit address signals to the pixel drive chip 17, and the pixel drive chip 17 may obtain a transmitted address by analyzing the address signals. The pixel drive chips 17 in two adjacent rows of the light emitting regions P arranged in the second direction F2 are sequentially connected in series. For example, the addressing signal lines 124 are connected with a first input end Di of a first pixel drive chip 17 connected in series; an output end Ou of an $m^{th}$ pixel drive chip 17 connected in series is connected with a first input end Di of an $(m+1)^{th}$ pixel drive chip 17 connected in series, m is a positive integer greater than 0 and smaller than n, and n is the quantity of the two adjacent rows of the light emitting regions P arranged in the second direction F2. The plurality of above signal lines 12 may further include a plurality of addressing connecting lines 125. An output end Ou of the last pixel drive chip 17 connected in series is coupled to the addressing signal lines 125, so as to form a loop for transmitting the address signals.

FIG. 6 is a schematic sectional view of FIG. 5 at a dotted line T. Referring to FIG. 6, the drive backplane in the embodiments of the present disclosure may include: a first metal layer 21 located on the base substrate 20, a second metal layer 22 located on one side of the first metal layer 21 facing away from the base substrate 20, a buffer layer 23 located between the first metal layer 21 and the base substrate 20, an inorganic layer 24 located between the first metal layer 21 and the second metal layer 22, and a planarization layer 25 located between the inorganic layer 24 and the second metal layer 22. In combination with FIG. 6 and FIG. 8, the respective signal lines 12 may be located on the same film layer. The respective connecting lines 16 may be located in the same film layer. Therefore, in a manufacturing process, process steps may be saved, and manufacturing costs are saved. Optionally, the respective signal lines 12 may be located in the first metal layer 21, and the respective connecting lines 16 may be located in the second metal layer 22. The inorganic layer 24 is arranged between the first metal layer 21 and the second metal layer 22, the sealing property of the drive backplane may be improved, the erosion of the drive backplane by water vapor and oxygen is prevented. In addition, if a high-temperature curing material is adopted to manufacture the planarization layer 25, the inorganic layer 24 may also prevent the first metal layer 21 from being oxidized at a high temperature. The planarization layer 25 is arranged between the inorganic layer 24 and the second metal layer 22, so that the second metal layer 22 may be flatter. The signal lines 12 may be electrically connected with the connecting lines 16 through via hole(s) V penetrating through the inorganic layer 24 and the planarization layer 25. In practical applications, the first metal layer 21 and the second metal layer 22 may be made of metal materials, such as metal copper or other metal materials, which is not limited here.

In addition, further referring to FIG. 6, the above drive backplane provided by the embodiments of the present disclosure may further include: an inorganic insulating layer 26 located on one side of the connecting lines (a film layer where the second metal layer 22 is located) facing away from the base substrate 20. The thickness of the inorganic insulating layer 26 is greater than 2000 Å. For example, the thickness of the inorganic insulating layer 26 may be set to about 5000 Å. In the embodiments of the present disclosure, by providing the inorganic insulating layer 26, the sealing property of the drive backplane may be further improved, the erosion of the drive backplane by the water vapor and the oxygen is prevented. Moreover, by increasing the thickness of the inorganic insulating layer 26, a planarization layer does not need to be arranged on one side of the inorganic insulating layer 26 facing away from the base substrate 20, so as to prevent the first contact electrodes (not shown in the figure) and the second contact electrodes 151 from being oxidized after the planarization layer absorbs water. In addition, after patterning the inorganic insulating layer 26, patterns of the first contact electrodes and the second contact electrodes may be directly formed, and a process of manufacturing the planarization layer is saved, and the manufacturing costs are saved.

Figure 10:
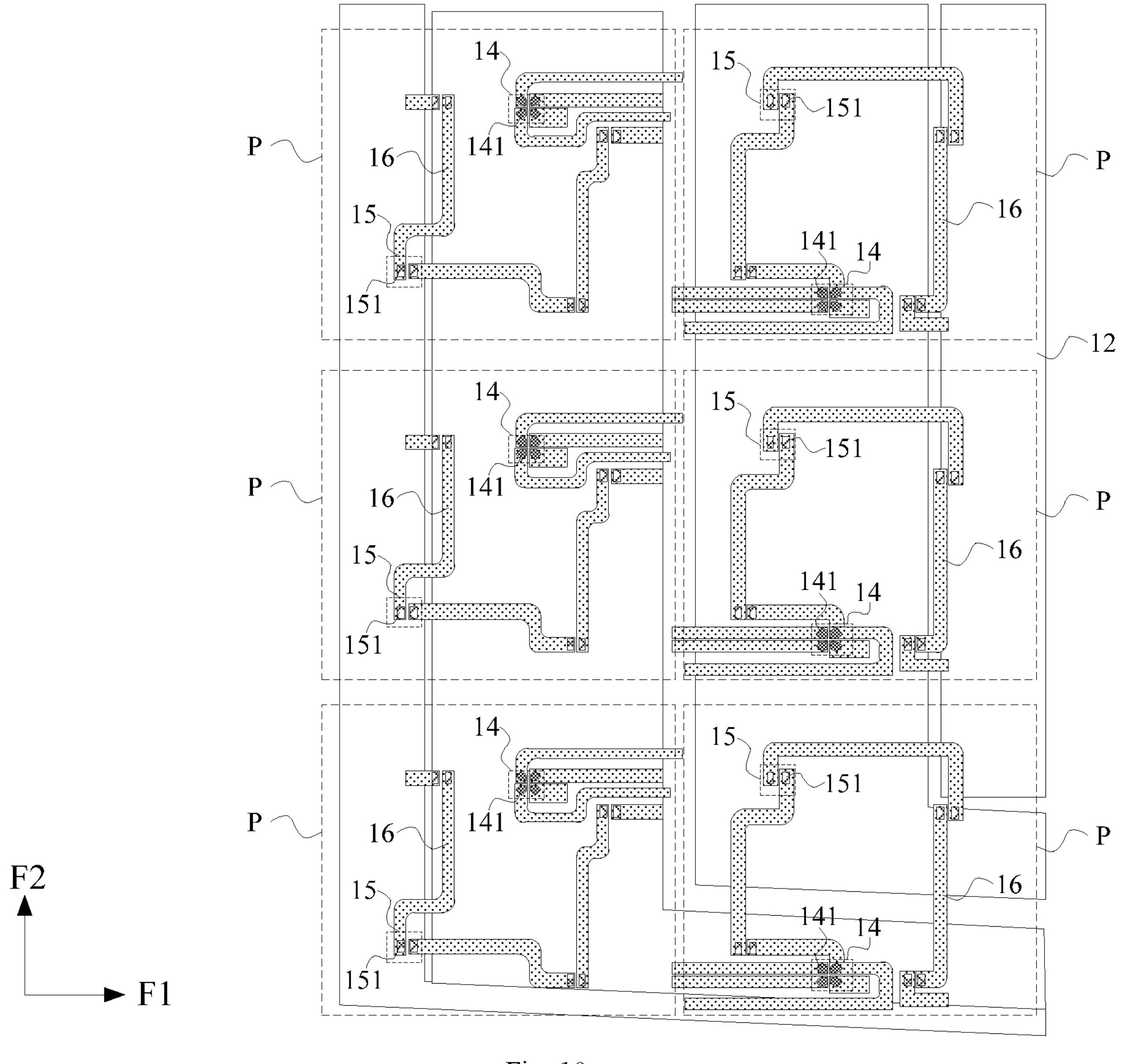
FIG. 10 is a schematic structural diagram of a light emitting region group in an embodiment of the present disclosure.

In practical applications, in the above drive backplane provided by the embodiments of the present disclosure, the plurality of light emitting regions are divided into a plurality of light emitting region groups. FIG. 10 is a schematic structural diagram of a light emitting region group in the embodiments of the present disclosure. As shown in FIG. 10, each light emitting region group includes two adjacent rows of the light emitting regions P arranged in the first direction F1.

In one row of light emitting regions P (such as a row of light emitting regions P on the left side in FIG. 10) of the light emitting region group, a first contact electrode group 14 is located in a partial region in the light emitting region P away from the binding electrode; and in the other row of light emitting regions P (such as a row of light emitting regions P on the right side in FIG. 10) of the light emitting region group, the first contact electrode group 14 is located in a partial region in the light emitting region P close to the binding electrode.

In the embodiments of the present disclosure, the signal lines are coupled to the corresponding binding electrodes through the fan-out lines. Moreover, there are at least two signal lines having different lengths in the second direction, and there are at least two connection line portions having different first distances, thus a fan-out region does not need to be set separately for take-up. Therefore, several lamp regions close to the binding region have enough spaces to set the first contact electrode groups 14, the second contact electrode groups 15 and the connecting lines 16. The winding of the connecting lines 16 may be set to make the arrangement of the first contact electrode groups 14 and the second contact electrode groups 15 more regular, thereby facilitating a binding process and an optical detection process for the light emitting diode and the pixel drive chip, and improving the efficiency of the binding process and the optical detection process. In addition, the obtained electrical and optical homogeneity of the display apparatus may be better, and the display effect is improved.

In the above drive backplane provided by the embodiments of the present disclosure, a plurality of connecting lines are arranged on a film layer between the signal lines and the first contact electrodes.

In combination with FIG. 5 and FIG. 8, part of the plurality of connecting lines 16 are configured to connect the signal lines 12 with the first contact electrodes 141, part of the plurality of connecting lines 16 are configured to connect the signal lines 12 with the second contact electrodes 151, part of the plurality of connecting lines 16 are configured to connect the first contact electrodes 141 with the second contact electrodes 151, part of the plurality of connecting lines 16 are configured to connect two first contact electrodes 141, and part of the plurality of connecting lines 16 are configured to connect two second contact electrodes 151.

At least part of the plurality of connecting lines 16 include: a first connecting portion 161 extending in the first direction F1 and a second connecting portion 162 extending in the second direction F2. Due to the large quantity of connecting lines 16 in the drive backplane, the connecting lines 16 are set to extend in the first direction F1 or the second direction F2, a phenomenon that the connecting lines 16 intersect with each other can be avoided, which is more conducive to wiring, and the wiring space in the drive backplane is fully utilized.

In order to avoid tip discharge at the position where the first connecting portion 161 is connected with the second connecting portion 162 in each connecting line 16, which leads to the problem that electrostatic discharge cannot be performed, in the embodiments of the present disclosure, the position where the first connecting portion 161 is connected with the second connecting portion 162 has a fillet setting, so as to avoid tip discharge. Optionally, the fillet setting may be performed on one side of the position where the first connecting portion 161 is connected with the second connecting portion 162, and the fillet setting may also be performed on two sides of the position.

In the embodiments of the present disclosure, the following methods are schematically provided to prepare the above drive backplane, but they should not limit a preparation method of the above drive backplane.

In some embodiments, as shown in FIG. 6, firstly, the buffer layer 23 is manufactured on the base substrate 20. Then the first metal layer 21 is formed on the buffer layer 23 by adopting a sputtering process. For example, a material of the first metal layer 21 may be metal copper. The first metal layer 21 is coated with a photoresist layer, and processes of baking, exposure, development, hard baking and the like are performed on the photoresist layer, so as to obtain a pattern of the photoresist layer. Then, the first metal layer 21 is etched under a mask of the pattern of the photoresist layer, and then, a pattern of the first metal layer 21 is obtained after the photoresist layer is peeled off. Then, the inorganic layer 24 is formed on the first metal layer 21, for example, the inorganic layer 24 may be manufactured by adopting a process such as chemical vapor deposition. The planarization layer 25 is coated with the inorganic layer 24, and the processes of exposure, development and the like are performed on the planarization layer 25, so as to form a pattern of the planarization layer 25, and then, the inorganic layer 24 is dry-etched under a mask of the pattern of the planarization layer 25, so as to obtain a pattern of the inorganic layer 24.

Then the second metal layer 22 is formed on the planarization layer 25 by adopting the sputtering process again, for example, a material of the second metal layer 22 may be metal copper. The second metal layer 22 is coated with a photoresist layer, and processes of baking, exposure, development, hard baking and the like are performed on the photoresist layer, so as to obtain a pattern of the photoresist layer. Then, the second metal layer 22 is etched under a mask of the pattern of the photoresist layer, and then, a pattern of the second metal layer 22 is obtained after the photoresist layer is peeled off. An inorganic insulating layer 26 is formed on the second metal layer 22, then the inorganic insulating layer 26 is coated with a photoresist layer, and processes of baking, exposure, development and the like are performed on the photoresist layer. Then, the inorganic insulating layer 26 is dry-etched under a mask of the pattern of the photoresist layer, so as to obtain a pattern of the inorganic insulating layer 26. Finally, each first contact electrode and each second contact electrode are formed on the inorganic insulating layer 26.

In some other embodiments, the difference from the above process steps is that a second manufacturing method adopts an electroplating process to form the pattern of the first metal layer. For example, the sputtering process is firstly adopted to form an electroplating seed layer on the base substrate 20. A material of the electroplating seed layer may be metal copper. Then, a photoresist layer is formed on the electroplating seed layer, and processes of baking, exposure, development, hard baking and the like are performed on the photoresist layer, so as to obtain a pattern of the photoresist layer. After that, the electroplating seed layer is etched under a mask of the pattern of the photoresist layer, and then, a pattern of the electroplating seed layer is obtained after the photoresist layer is peeled off. The pattern of the first metal layer 21 is formed by adopting an electroplating process.

Based on the same inventive concept, Embodiments of the present disclosure further provide a display apparatus, including: any above drive backplane, and a plurality of pixel drive chips and a plurality of light emitting diodes which are coupled to the drive backplane. The display apparatus may be applied to a mobile phone, a tablet computer, a television, a display, a laptop, a digital photo frame, a navigator and any product or component with a display function. Since the principle for solving problems of the display apparatus is similar to that of the above drive backplane, implementation of the display apparatus may refer to implementation of the above drive backplane, and repetitions are omitted herein.

Although the preferred embodiments of the present disclosure have been described, those skilled in the art can make additional changes and modifications to these embodiments once they know the basic creative concept. Thus, the appended claims are intended to be construed to include the preferred embodiments and all changes and modifications that fall within the scope of the present disclosure.

Apparently, those skilled in the art can make various modifications and variations to the embodiments of the present disclosure without departing from the spirit and scope of the embodiments of the present disclosure. In this way, under the condition that these modifications and variations to the embodiments of the present disclosure fall within the scope of the claims of the present disclosure and equivalent technologies thereof, the present disclosure is also intended to include these modifications and variations.

What is claimed is:

1. A drive backplane, comprising:

a base substrate;

a plurality of binding electrodes in a binding region on the base substrate;

a plurality of signal lines in a display region on the base substrate, wherein the plurality of signal lines extend in a second direction and are arranged in a first direction, the first direction and the second direction intersect with each other, and at least two signal lines among the plurality of signal lines have different lengths in the second direction; the display region comprises a plurality of lamp regions which extend in the first direction and are arranged in the second direction and a plurality of fan-out lines on the base substrate, wherein at least part of the plurality of fan-out lines overlap at least one of the plurality of lamp regions, and at least one fan-out line among the plurality of fan-out lines comprises:

a connection line portion, an extension direction of which forms an included angle with the second direction, and a first straight line portion extending in the second direction;

wherein the included angle is greater than 0° and less than 180°, one end of the connection line portion is coupled to one end of the signal line close to the binding electrode, and another end of the connection line portion is coupled to the first straight line portion; one end of the first straight line portion away from the connection line portion is coupled to the binding electrode;

a distance, in a direction perpendicular to the first direction, between the two ends of the connection line portion is a first distance; and the first distances of at least two connection line portions are different;

wherein the drive backplane is provided with:

two first side edges which extend in the second direction and are oppositely arranged, and a first axis extending in the second direction between the two first side edges;

wherein for at least two signal lines between one of the two first side edges and the first axis, a length of the signal line close to the one first side edge is greater than a length of the signal line close to the first axis; and for at least two fan-out lines between one of the two first side edges and the first axis, a first distance of a connection line portion of the fan-out line close to the one first side edge is smaller than a first distance of a connection line portion of the fan-out line close to the first axis.

2. The drive backplane according to claim 1, wherein the connection line portions of the fan-out lines are symmetrically distributed with respect to the first axis.

3. The drive backplane according to claim 1, wherein the drive backplane is provided with a plurality of light emitting regions arranged in an array in the first direction and the second direction;

the plurality of signal lines are divided into a plurality of signal line groups; each signal line group comprises a plurality of signal lines coupled to at least one row of light emitting regions arranged in the second direction; and a difference between the first distances of different connection line portions coupled to signal lines in a same signal line group is smaller than a set value, and a difference between the first distances of different connection line portions coupled to signal lines in different signal line groups is greater than the set value.

4. The drive backplane according to claim 1, wherein a width of at least one signal line among the plurality of signal lines is greater than a width of the fan-out line.

5. The drive backplane according to claim 1, wherein at least one fan-out line among the plurality of fan-out lines further comprises:

a second straight line portion extending in the second direction;

wherein one end of the second straight line portion is coupled to the one end of the signal line close to the binding electrode, and another end of the second straight line portion is coupled to one end of the connection line portion away from the first straight line portion.

6. The drive backplane according to claim 3, further comprising:

a plurality of first contact electrode groups and a plurality of second contact electrode groups on the base substrate;

wherein each light emitting region is provided with one first contact electrode group and at least three second contact electrode groups; each first contact electrode group comprises: a plurality of first contact electrodes configured to be coupled to pins of a pixel drive chip; and each second contact electrode group comprises: two second contact electrodes configured to be coupled to electrodes of a light emitting diode;

the signal lines are located between a film layer where the second contact electrodes are located and the base substrate; and orthographic projections of the second contact electrodes on the base substrate are located within a range of an orthographic projection of at least one signal line among the plurality of signal lines on the base substrate.

7. The drive backplane according to claim 6, wherein in at least two adjacent signal lines among the plurality of signal lines, one of the two adjacent signal lines has a convex portion facing another one of the two adjacent signal lines, and the another one of the two adjacent signal lines has a concave portion corresponding to the convex portion; and the orthographic projections of the second contact electrodes on the base substrate are located within a range of an orthographic projection of a same signal line on the base substrate.

8. The drive backplane according to claim 6, wherein the plurality of signal lines comprise:

a plurality of first power signal lines, a plurality of second power signal lines, a plurality of fixed voltage signal lines, and a plurality of addressing signal lines; wherein:

the first power signal lines are coupled to the second contact electrodes in a row of the light emitting regions arranged in the second direction;

the second power signal lines are coupled to the first contact electrodes in a row of the light emitting regions arranged in the second direction;

the fixed voltage signal lines are coupled to the first contact electrodes in a row of the light emitting regions arranged in the second direction; and the addressing signal lines are coupled to the first contact electrodes in two adjacent rows of the light emitting regions arranged in the second direction.

9. The drive backplane according to claim 6, wherein the plurality of light emitting regions are divided into a plurality of light emitting region groups, and each light emitting region group comprises two adjacent rows of the light emitting regions arranged in the second direction; and in one row of the light emitting regions of the light emitting region group, the first contact electrode group is located in a partial region in the light emitting region away from the binding electrode; and in another row of the light emitting regions of the light emitting region group, the first contact electrode group is located in a partial region in the light emitting region close to the binding electrode.

10. The drive backplane according to claim 6, further comprising:

a plurality of connecting lines on a film layer between the signal lines and the first contact electrodes;

wherein part of the plurality of connecting lines are configured to connect the signal lines with the first contact electrodes, part of the plurality of connecting lines are configured to connect the signal lines with the second contact electrodes, part of the plurality of connecting lines are configured to connect the first contact electrodes with the second contact electrodes, part of the plurality of connecting lines are configured to connect two first contact electrodes, and part of the plurality of connecting lines are configured to connect two second contact electrodes; and at least part of the plurality of connecting lines comprise:

a first connecting portion extending in the first direction, and a second connecting portion extending in the second direction.

11. The drive backplane according to claim 10, wherein a position where the first connecting portion is connected with the second connecting portion has a fillet setting.

12. The drive backplane according to claim 10, further comprising:

an inorganic insulating layer on one side of the connecting lines facing away from the base substrate;

wherein a thickness of the inorganic insulating layer is greater than 2000 Å.

13. A display apparatus, comprising: the drive backplane according to claim 1, and a plurality of pixel drive chips and a plurality of light emitting diodes which are coupled to the drive backplane.

14. The drive backplane according to claim 1, wherein a width of the one end of the connection line portion away from the binding electrode is greater than a width of the another end of the connection line portion close to the binding electrode.

15. The drive backplane according to claim 14, wherein the width of the another end of the connection line portion close to the binding electrode is greater than a width of the first straight line portion.

* * * * *